Oct. 6, 1970 SEIICHI IWAMATSU 3,531,857

METHOD OF MANUFACTURING SUBSTRATE FOR SEMICONDUCTOR INTEGRATED CIRCUIT

Filed July 26, 1967

INVENTOR

SEIICHI IWAMATSU

BY Paul M. Craig, Jr.

ATTORNEY

United States Patent Office 3,531,857

Patented Oct. 6, 1970

3,531,857

METHOD OF MANUFACTURING SUBSTRATE FOR SEMICONDUCTOR INTEGRATED CIRCUIT

Seiichi Iwamatsu, Kodaira-shi, Japan, assignor to Hitachi, Ltd., Tokyo, Japan, a corporation of Japan Filed July 26, 1967, Ser. No. 656,180
Int. Cl. B01j *17/00*
U.S. Cl. 29—583 6 Claims

ABSTRACT OF THE DISCLOSURE

A method of manufacturing a substrate for a semiconductor integrated circuit, which includes the step of forming a plurality of monocrystalline silicon regions in a polycrystalline silicon substrate to define circuit elements, whereby the regions are electrically isolated from each other by means of an insulator such as $SiO_2$. In this method, a silicon wafer having one main surface thereof covered with $SiO_2$ is placed on a readily removable pedestal with the $SiO_2$ disposed in contact with the pedestal, and grooves of grid-like pattern are formed in the other main surface of the silicon wafer opposite the one main surface thereof so that the wafer is divided on its $SiO_2$ side into a plurality of sections. Then, the entire exposed surface of the wafer is oxidized so as to be covered with a film of $SiO_2$. Thereafter polycrystalline silicon adapted for serving as a substrate is deposited in sufficient thickness on the $SiO_2$ film.

BACKGROUND OF THE INVENTION

This invention relates to a method of manufacturing a substrate for a semiconductor integrated circuit, and more particularly to a method of manufacturing a substrate for a semiconductor integrated circuit which includes a plurality of electrically isolated monocrystalline semiconductor regions adapted for defining circuit elements.

Recently, a variety of studies have actively been made on so-called semiconductor integrated circuits which have a plurality of active and passive elements incorporated in a single semiconductor wafer so as to provide function circuits. In an attempt to integrate such function circuits, one of the most important points is how to electrically isolate the active elements from each other. For this purpose, at present use is made of various methods such as, for example, a method of isolation by etched grooves, a method of isolation by PN junctions, a method of dielectric isolation and the like.

This invention is especially directed to improvements in a substrate for a semiconductor integrated circuit provided by the method of dielectric isolation.

According to one of the conventional dielectric isolation methods, preparation is made for a structure having a polycrystalline silicon layer (used as a support) and a monocrystalline silicon layer which are formed respectively on the upper and lower surfaces of an insulator layer such as $SiO_2$. Then the monocrystalline silicon is divided on the $SiO_2$ layer side into a plurality of sections by moats, and the exposed surfaces of the monocrystalline portion thus divided are coated with an $SiO_2$ film on which is deposited polycrystalline silicon in a sufficient thickness to form a substrate for a semiconductor integrated circuit, thus providing a substrate layer. Subsequently, the polycrystalline layer initially formed as the support is removed, so that a plurality of monocrystalline silicon regions having the surfaces thereof covered with an $SiO_2$ layer and being electrically isolated from each other are formed in the polycrystalline silicon substrate.

Although such dielectric isolation method is advanageous in that it enhances element reliability and minimizes parasitic capacitance, it is not suited for mass production since it includes several steps of removing semichemical etching or the like (difficulties are encountered in controlling such steps) and thus it leads to a lower yield of acceptable products.

Accordingly, it is an object of this invention to provide a simple method of manufacturing a substarte for a semiconductor integrated circuit.

Another object of this invention is to provide a method which permits the manufacture of a substrate for a semiconductor integrated circuit on a mass-production basis which can readily be formed into a semiconductor integrated circuit.

The gist of this invention resides in a method of producing a wafer for a semiconductor integrated circuit which comprises the steps of providing a plurality of monocrystalline semiconductor segments each adapted to form a circuit element on a very thin insulator layer, and fixing the monocrystalline segments by means of a fixing material such as metal, non-metal, semiconductor or the like from the side opposite to the thin layer. This is based on the inventor's finding that a very thin layer of silicon oxide film or the like has sufficient strength to hold a silicon tip.

Other objects, advantages and features of this invention will become apparent from the following description in conjunction with the accompanying drawings.

DESCRIPTION OF PREFERRED EMBODIMENT

Figure 1:
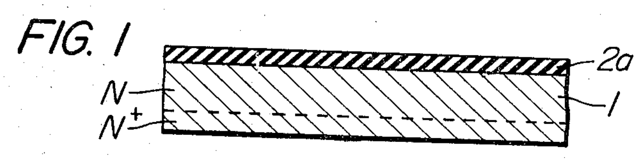
FIGS. 1 to 6 are schematic sectional views illustrating the steps of manufacturing a substrate for an integrated circuit according to an embodiment of this invention.
Figure 2:
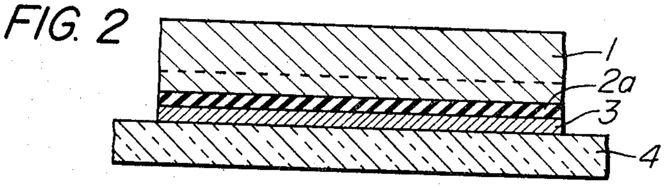
Figure 3:
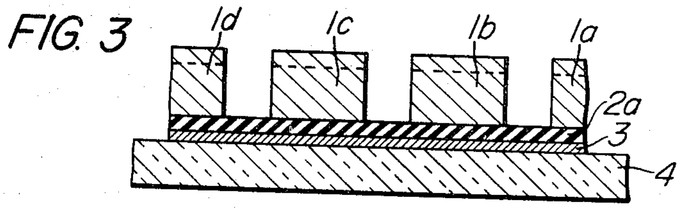

FIG. 1 shows a structure comprising an N-type monocrystalline silicon wafer 1 (containing a highly doped region N+) having a thin insulator layer 2*a* of silicon oxide formed thereon. The insulator layer 2*a*, which is 8000 A. in thickness, is suitable for the following treatment processes. The insulator layer 2*a* is cemented to a glass support 4 by bees' wax 3, as illustrated in FIG. 2. Thereafter, the N-type monocrystalline silicon wafer 1 is subjected to photo-etching treatment so that grooves are formed which separate the sections 1*a*, 1*b*, 1*c*, and 1*d*, as shown in FIG. 3.

Figure 4:
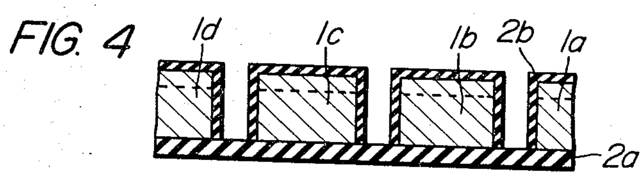
Figure 5:
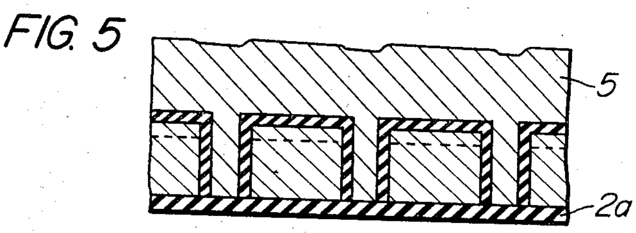
Figure 6:
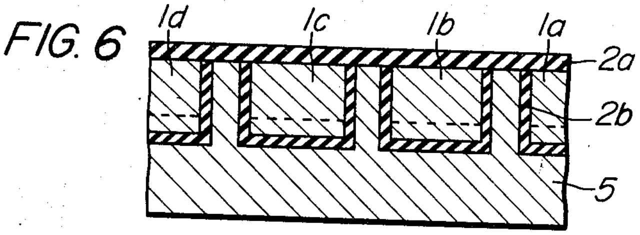

Subsequently, the aforementioned bees' wax is heated to a temperature of about 50° C. so as to be softened. Alternatively, it is immersed in trichloroethylene so as to be dissolved. Thus the structure described above is removed from the support 4. In this case, a plurality of semiconductor sections each of which is to form an element are held merely by the silicon oxide layer 2*a*. FIG. 4 shows such a structure resting on a plane surface of a pedestal formed of silica (the pedestal is not shown in the figure) so that the oxide layer 2*a* faces the plane surface, the structure being formed with a silicon oxide film 2*b* while being exposed to a high temperature vapor environment. In order to form such silicon oxide film 2*b*, use may be made of a well-known method such as the anodic oxidation method or the thermal decomposition method. Thereafter, the structure shown in FIG. 4 is placed in a furnace, which is maintained at an elevated temperature (1200°–1300° C.), while resting on the pedestal. Then a halogen compound of silicon is introduced into the furnace together with a carrier gas ($H_2$) so that the halogen compound is reduced with hydrogen. Thus polycrystalline silicon 5 is deposited on silicon oxide indicated by 2*a* and 2*b* from vapor phase, as illustrated in FIG. 5. The structure is taken out of the furnace and then the surface of polycrystalline silicon 5 is flattened by means of polishing or etching. In this way, a desired wafer or substrate for an integrated circuit is obtained, as illustrated in FIG. 6. The thus obtained wafer is particularly useful in that since its entire semiconductor surface is covered with silicon oxide it can immediately be subjected to a treatment of selective diffusion with silicon oxide serving as a selection mask. Furthermore, the difficulties encountered in controlling the polishing and etching treatments described hereinbefore are completely removed since no such controlling step is included in the method of this invention. That is, it is to be noted that in the prior art, polycrystalline silicon was also closely adhered to the surface of the thin layer 2_a_ as a support and therefore it was necessary to include a step of removing such polycrystalline silicon, while in accordance with this invention the structure merely rests on a pedestal and therefore no such step is required.

Although, in the foregoing, description has been made of the case where use is made of a silicon oxide layer of about 8000 A. as the insulator layer 2_a_, it has been found that thermally produced silicon oxide can well withstand the treatment in the subsequent steps if it has a thickness larger than 5000 A. In addition, it has also been found that silicon nitride used as the insulator layer 2_a_ represents a sufficient supporting strength if it has a thickness larger than 2000 A. Although a plurality of semiconductor sections have been illustrated as being supported through an insulator film 2_a_ on polycrystalline silicon grown from vapor phase, such polycrystalline silicon may be substituted by a metal such as molybdenum having a similar coefficient of expansion to that of a semiconductor material such as silicon or germanium. Furthermore, although the semiconductor sections 1_a_, 1_b_, 1_c_ and 1_d_ were covered with an $SiO_2$ layer 2_b_, this is not essentially required if ceramic or glass is used as a base material instead of the aforementioned polycrystalline silicon 5.

What is claimed is:

1. In a method of manufacturing a semiconductor integrated circuit, in which a plurality of monocrystalline semiconductor segments are arranged on an inorganic insulating layer, a base plate is mechanically fixed to said plurality of semiconductor segments so that said plurality of semiconductor segments are unitarily combined with each other but electrically isolated from each other, and an impurity is introduced into at least one of said semiconductor segments through a hole formed in said inorganic insulating layer to form a circuit element therein, the improvement comprising the steps of preparing a combination of said inorganic insulating layer and said plurality of monocrystalline semiconductor segments formed on said insulating layer, said inorganic insulating layer having a thickness of from several thousands of angstroms to several microns, said semiconductor segments being supported only by said insulating layer, placing the combination on a plane surface of a pedestal so that the insulating layer directly contacts but does not adhere to the pedestal, forming said base plate on said semiconductor segments on the side of said insulating layer opposite said pedestal, and removing the combination thus composed from said pedestal.

2. A method of manufacturing a semiconductor integrated circuit, including forming on one major surface of a single base plate a plurality of monocrystalline semiconductor regions which are electrically isolated from each other, and introducing conductivity type determining impurities into said regions so as to form circuit elements, said method comprising the steps of:

(a) forming a thin insulation layer on a plane major surface of a monocrystalline semiconductor substrate;

(b) placing the combination of the semiconductor substrate and the thin insulator layer on a releasable support so that the thin insulator layer faces to the support;

(c) forming in said semiconductor substrate at least one moat reaching from the opposing major surface thereof to said first-mentioned plane major surface to divide the substrate into a plurality of monocrystalline semiconductor segments arranged on said thin insulator layer;

(d) removing the combination of said insulator layer and said plurality of semiconductor segments from said releasable support, said plurality of semiconductor segments being supported only by said insulator layer;

(e) forming another insulator layer on the surface of each of said monocrystalline semiconductor segments not covered with said thin insulator layer;

(f) placing the combination on a plane surface of a pedestal without adhering said combination thereto so that said thin insulator layer faces the plane surface of said pedestal;

(g) coating said combination with a semiconductor layer serving as said base plate in such a manner that said monocrystalline semiconductor segments are sufficiently covered with said semiconductor layer so as to be unitarily integral with each other;

(h) removing the combination thus composed from said pedestal; and (i) introducing conductivity type determining impurities into said monocrystalline semiconductor segments through holes formed in said thin insulator layer thereby forming circuit elements.

3. A method as set forth in claim 2, wherein said insulator layers are formed of a compound of silicon, said semiconductor layer and said monocrystalline semiconductor segments are formed of silicon, and said semiconductor layer is deposited as a polycrystalline semiconductor layer from vapor phase.

4. A method as set forth in claim 2, wherein said monocrystalline semiconductor substrate is formed of a semiconductor of a particular conductivity type, and a highly doped region of said particular conductivity type is previously formed in the opposing major surface of said monocrystalline semiconductor substrate opposite to that on which said other insulator layer is to be provided.

5. A method of manufacturing a semiconductor substrate for an integrated circuit, comprising the steps of:

(a) forming on one major surface of said semiconductor substrate an inorganic insulating film of a thickness of from several thousands of angstroms to several microns;

(b) cementing the combination of the semiconductor substrate and the insulating film to a support so that said insulating film faces to said support;

(c) grooving said semiconductor substrate to divide the substrate into a plurality of monocrystalline semiconductor segments which are arranged on said insulating film;

(d) removing the combination of said insulating film and the plurality of monocrystalline semiconductor segments from said support, said plurality of semiconductor segments being supported only by said insulating film;

(e) removably mounting the combination including the insulating film and the plurality of semiconductor segments on a plane surface of a pedestal so that said insulating film faces the plane surface of said pedestal;

(f) covering the combination including the insulating film and the plurality of semiconductor segments arranged on the insulating film with a supporting means for unitarily supporting said plurality of semiconductor segments and for electrically isolating the plurality of semiconductor segments from each other; and (g) removing the combination including the insulating film, the plurality of semiconductor segments and said supporting means from said pedestal.

6. A method of manufacturing a substrate for a semicondutcor integrated circuit, comprising the steps of:

(a) forming a thin insulating film of a silicon compound selected from the group consisting of silicon oxide and silicon nitride on a plane major surface of a monocrystalline semiconductor substrate;

(b) adhering the combination on a surface of a support with a cement material so that the insulating film faces the surface of the support;

(c) forming in said semiconductor substrate a groove reaching from the opposing major surface to said plane major surface to divide the substrate into a plurality of monocrystalline semiconductor segments arranged on said insulating film;

(d) removing the combination of said thin insulating film and said plurality of semiconductor segments from said support by removing said cementing material, said plurality of semoconductor segments now being supported only by said thin insulating film;

(e) placing the combination thus obtained on a plane surface of a pedestal without adhering said thus obtained combination thereto so that said insulating film faces the plane surface of said pedestal;

(f) covering the surfaces of each of said semiconductor segments not covered with said thin insulating film with another insulating film to ensure that each of said semiconductor segments is completely insulated;

(g) depositing a semiconductor material on the completely insulated semiconductor segments to unitarily combine said segments, said insulating films and said semiconductor material; and (h) removing the combination thus composed from said pedestal.

References Cited

UNITED STATES PATENTS

| | | | |
|---|---|---|---|
| 2,984,897 | 5/1961 | Godfrey. | |
| 3,158,788 | 11/1964 | Last. | |
| 3,158,927 | 12/1964 | Saunders | 29—577 |
| 3,165,811 | 1/1965 | Kleimack et al. | |
| 3,290,753 | 12/1966 | Chang | 29—577 |
| 3,391,023 | 7/1968 | Frescura. | |

OTHER REFERENCES

"Electrochemical Technology," vol. 4, No. 1–2, January-February 1966, pp. 57–61.

IBM Tech. Bull., vol. 8, No. 5, October 1965, pp. 802, 803.

IBM Tech. Bull., vol. 8, No. 1, June 1965, p. 181.

"Electronics," Dec. 13, 1965, p. 96.

PAUL M. COHEN, Primary Examiner

U.S. Cl. X.R.

29—423, 572, 576; 148—187; 317—235